(12) United States Patent
Kothandapani et al.

(10) Patent No.: US 10,357,841 B2
(45) Date of Patent: Jul. 23, 2019

(54) METAL CAP ASSEMBLY FOR OPTICAL COMMUNICATIONS

(71) Applicant: Materion Corporation, Mayfield Heights, OH (US)

(72) Inventors: Ramesh Kothandapani, Singapore (SG); Chee Kong Lee, Singapore (SG)

(73) Assignee: MATERION CORPORATION, Mayfield Heights, OH (US)

(*) Notice: Subject to any disclaimer, the term of this patent is extended or adjusted under 35 U.S.C. 154(b) by 71 days.

(21) Appl. No.: 15/380,247

(22) Filed: Dec. 15, 2016

(65) Prior Publication Data

US 2017/0095870 A1 Apr. 6, 2017

Related U.S. Application Data

(62) Division of application No. 14/335,042, filed on Jul. 18, 2014, now Pat. No. 9,560,781.

(Continued)

(51) Int. Cl.
| | |
|---|---|
| *B23K 31/02* | (2006.01) |
| *B23K 1/00* | (2006.01) |
| *B23K 35/02* | (2006.01) |
| *H05K 5/00* | (2006.01) |
| *H05K 5/03* | (2006.01) |

(Continued)

(52) U.S. Cl.
CPC ........ *B23K 1/0016* (2013.01); *B23K 35/0222* (2013.01); *B23K 35/3013* (2013.01); *C22C 5/02* (2013.01); *H01L 23/04* (2013.01); *H01S 5/02296* (2013.01); *H05K 5/0095* (2013.01); *H05K 5/03* (2013.01); *H05K 5/04* (2013.01); *H05K 5/062* (2013.01); *B23K 2101/40* (2018.08); *B32B 38/08* (2013.01); *H01L 21/50* (2013.01); *H01L 2924/0002* (2013.01); *Y10T 156/1052* (2015.01)

(58) Field of Classification Search
CPC .............. B23K 1/0016; B23K 35/3013; B23K 35/0222; B23K 2201/40; B23K 35/0233–35/0244; B23K 2201/36; B23K 2201/42; H05K 5/04; H05K 5/062; H05K 5/03; H01S 5/02296; C22C 5/02
USPC ...... 228/179.1–180.22, 245–262, 121–124.7
See application file for complete search history.

(56) References Cited

U.S. PATENT DOCUMENTS

| | | | | |
|---|---|---|---|---|
| 2,075,477 A | * | 3/1937 | Smith .................... | B65D 25/54 205/118 |
| 2,235,680 A | * | 3/1941 | Haven ...................... | B23K 1/19 156/106 |

(Continued)

*Primary Examiner* — Kiley S Stoner
(74) *Attorney, Agent, or Firm* — Fay Sharpe LLP

(57) ABSTRACT

A cap assembly for optical communications comprising a housing that includes a front side perpendicular from a bottom side, opposing parallel first and second sides perpendicular from the bottom side, and a back side disposed perpendicularly between the first side and the second side offset from respective ends of the first side and the second side opposite the front side. The back side includes an opening there-through and a three-sided ledge formed along an interior of the first side leg, an exterior of the back side, and an interior of the second side leg. The cap assembly further includes a window configured to contact the three-sided ledge of the back side, the glass panel covering the opening there-through and attached to the assembly via a solder pre-form.

4 Claims, 18 Drawing Sheets

Related U.S. Application Data

(60) Provisional application No. 61/856,303, filed on Jul. 19, 2013.

(51) Int. Cl.

| | |
|---|---|
| *H05K 5/04* | (2006.01) |
| *H01L 23/04* | (2006.01) |
| *H01S 5/022* | (2006.01) |
| *B23K 35/30* | (2006.01) |
| *C22C 5/02* | (2006.01) |
| *H05K 5/06* | (2006.01) |
| *B23K 101/40* | (2006.01) |
| *B32B 38/08* | (2006.01) |
| *H01L 21/50* | (2006.01) |

(56) References Cited

U.S. PATENT DOCUMENTS

| | | | | |
|---|---|---|---|---|
| 2,235,681 A * | 3/1941 | Haven | ............... | E06B 3/66342 156/109 |
| 3,793,064 A * | 2/1974 | Budd | ............... | H01L 23/057 228/121 |
| 4,403,243 A * | 9/1983 | Hakamada | ............... | H01S 5/02212 174/50.62 |
| 5,423,119 A * | 6/1995 | Yang | ............... | H01L 25/165 174/536 |
| 5,635,766 A * | 6/1997 | Cain | ............... | H01L 23/3185 257/701 |
| 6,314,117 B1 * | 11/2001 | Heim | ............... | H01S 5/02212 257/433 |
| 6,492,699 B1 * | 12/2002 | Glenn | ............... | H01L 27/14618 257/433 |
| 6,566,745 B1 * | 5/2003 | Beyne | ............... | H01L 27/14618 257/431 |
| 2002/0179989 A1 * | 12/2002 | Tatoh | ............... | H01L 31/0203 257/434 |
| 2004/0104460 A1 * | 6/2004 | Stark | ............... | B81B 7/0067 257/678 |
| 2004/0188124 A1 * | 9/2004 | Stark | ............... | B81B 7/0067 174/535 |
| 2004/0195580 A1 * | 10/2004 | Nishizawa | ............... | H01S 5/02296 257/99 |
| 2004/0238600 A1 * | 12/2004 | Tarn | ............... | B81C 1/00269 228/124.6 |
| 2006/0187608 A1 * | 8/2006 | Stark | ............... | C03C 27/08 361/202 |
| 2007/0004080 A1 * | 1/2007 | Ouyang | ............... | B81B 7/007 438/106 |
| 2007/0170359 A1 * | 7/2007 | Syllaios | ............... | G01J 3/02 250/338.1 |
| 2007/0170360 A1 * | 7/2007 | Gooch | ............... | G01J 5/20 250/338.1 |
| 2007/0190691 A1 * | 8/2007 | Humpston | ............... | B81C 1/00269 438/113 |
| 2007/0190747 A1 * | 8/2007 | Humpston | ............... | B81C 1/00285 438/460 |
| 2007/0243663 A1 * | 10/2007 | Chen | ............... | H01L 23/3114 438/106 |
| 2007/0249091 A1 * | 10/2007 | Pan | ............... | B81C 1/00293 438/107 |
| 2008/0045991 A1 * | 2/2008 | Mihalca | ............... | A61B 1/00096 606/176 |
| 2009/0294789 A1 * | 12/2009 | Yoshida | ............... | H01S 5/02292 257/98 |
| 2011/0280266 A1 * | 11/2011 | Hayashi | ............... | H01S 5/02216 372/43.01 |
| 2011/0280270 A1 * | 11/2011 | Hayashi | ............... | H01S 5/02216 372/50.1 |
| 2012/0033695 A1 * | 2/2012 | Hayashi | ............... | H01S 5/02204 372/43.01 |
| 2013/0206230 A1 * | 8/2013 | Sridharan | ............... | H01L 23/10 136/259 |
| 2014/0203424 A1 * | 7/2014 | Shimanouchi | ............... | H03H 9/1057 257/704 |
| 2015/0358558 A1 * | 12/2015 | McKenzie | ............... | H01L 27/14649 438/7 |
| 2016/0047691 A1 * | 2/2016 | Carlson | ............... | G01J 5/046 250/338.3 |
| 2016/0062127 A1 * | 3/2016 | Gittler | ............... | G01J 5/0875 359/894 |
| 2017/0328779 A1 * | 11/2017 | Carlson | ............... | G01J 5/20 |

* cited by examiner

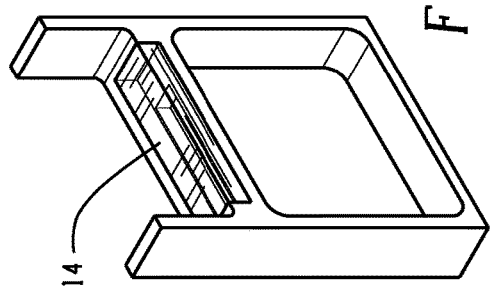
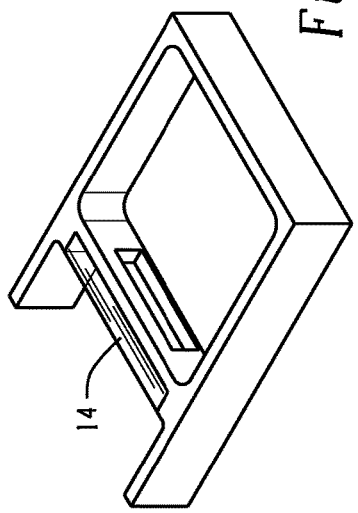
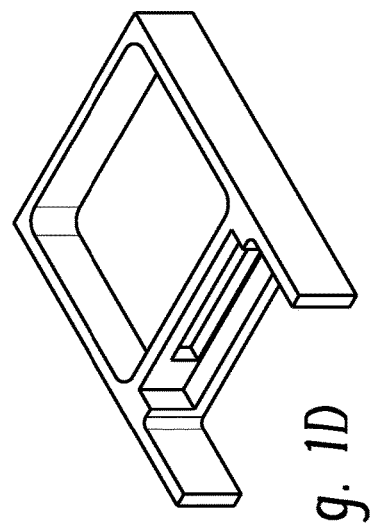
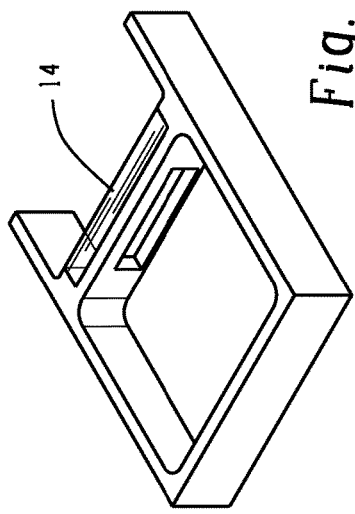
Fig. 1D
Fig. 1E
Fig. 1F
Fig. 1G

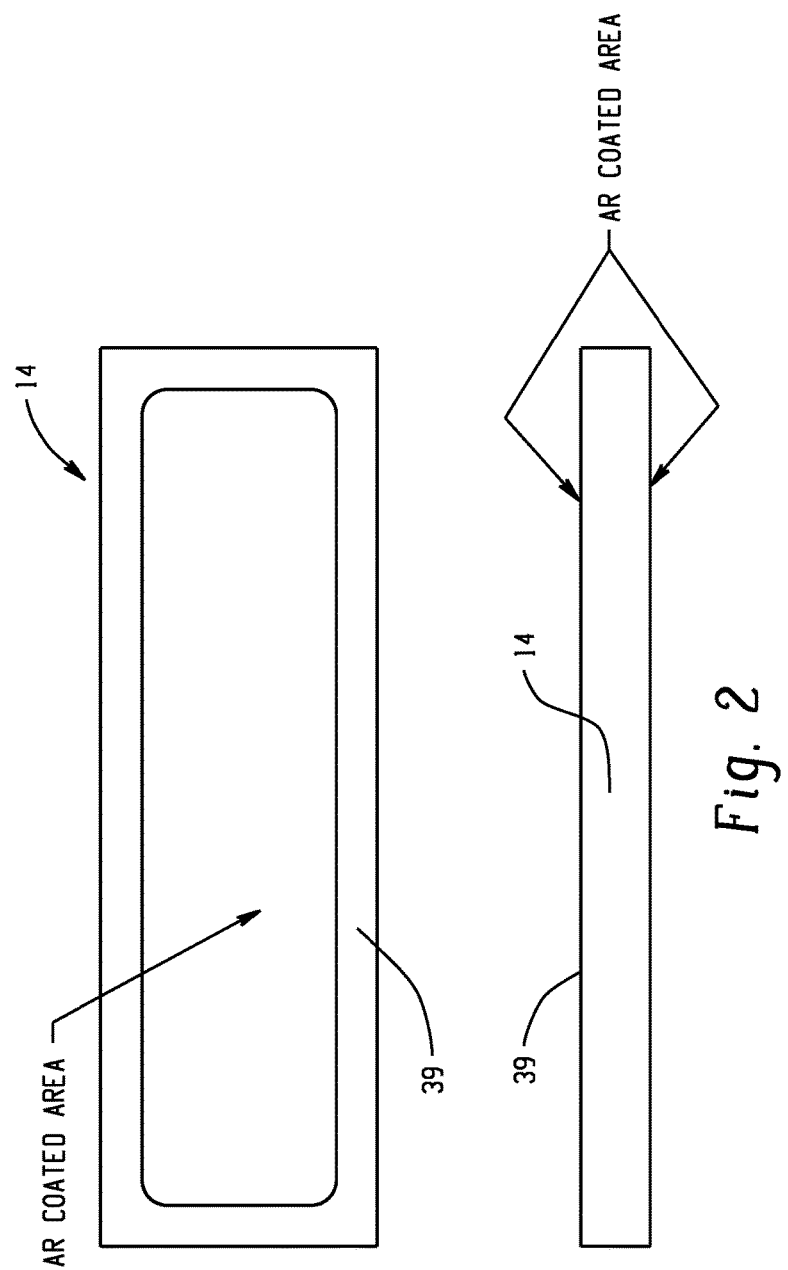

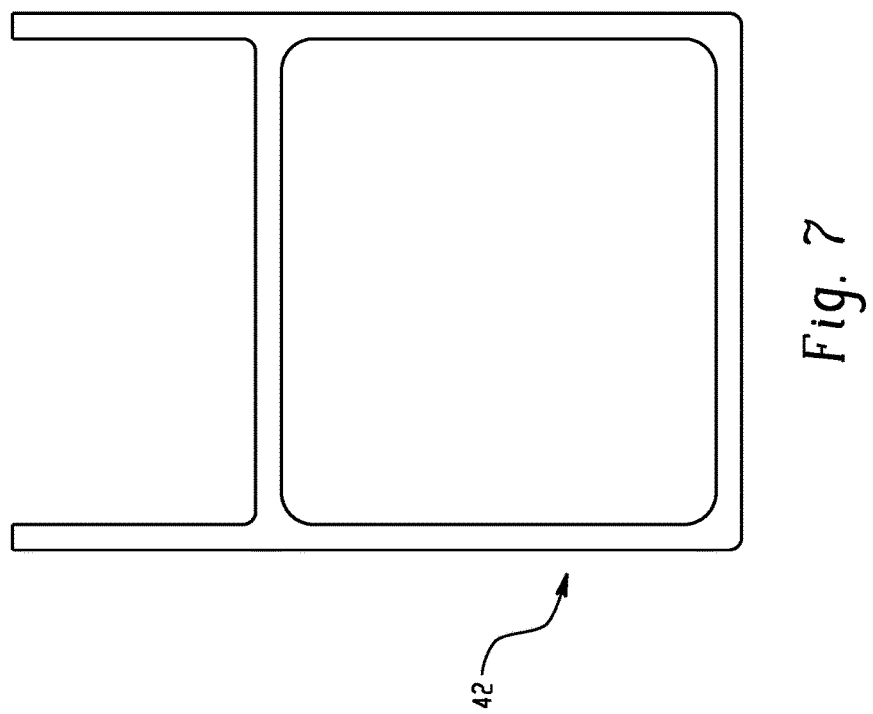

AR COAT DATA

| AR SIDE 1 & 2 @ 0 DEG | | |
|---|---|---|
| WAVELENGTH (nm) | %R | %T |
| 1300 | 0.03215 | 99.96785 |
| 1301 | 0.03194 | 99.96806 |
| 1302 | 0.03170 | 99.96830 |
| 1303 | 0.03142 | 99.96857 |
| 1304 | 0.03112 | 99.96888 |
| 1305 | 0.03079 | 99.96921 |
| 1306 | 0.03043 | 99.96957 |
| 1307 | 0.03005 | 99.96995 |
| 1308 | 0.02964 | 99.97036 |
| 1309 | 0.02920 | 99.97079 |
| 1310 | 0.02874 | 99.97125 |
| 1311 | 0.02826 | 99.97173 |
| 1312 | 0.02776 | 99.97224 |
| 1313 | 0.02723 | 99.97277 |
| 1314 | 0.02668 | 99.97332 |
| 1315 | 0.02611 | 99.97388 |
| 1316 | 0.02553 | 99.97447 |
| 1317 | 0.02492 | 99.97508 |
| 1318 | 0.02430 | 99.97570 |
| 1319 | 0.02367 | 99.97633 |
| 1320 | 0.02302 | 99.97698 |

*Fig. 8B*

GLASS DATA

| REFRACTIVE INDICES | | |
|---|---|---|
| | λ (nm) | |
| $n_r$ | 706.5 | 1.51289 |
| $n_c$ | 656.3 | 1.51432 |
| $n_{c'}$ | 643.8 | 1.51472 |
| $n_{He-Ne}$ | 632.8 | 1.51509 |
| $n_D$ | 589.3 | 1.51673 |
| $n_d$ | 587.6 | 1.51680 |
| $n_e$ | 546.1 | 1.51872 |
| $n_F$ | 486.1 | 1.52237 |
| $n_{F'}$ | 480.0 | 1.52282 |
| $n_g$ | 435.8 | 1.52667 |
| $n_h$ | 404.7 | 1.53022 |
| $n_i$ | 365.0 | 1.53622 |

| CHEMICAL PROPERTIES | |
|---|---|
| | GRADE |
| RC(S) | 1 |
| RA(S) | 1 |
| DW | 3 |
| DA | 1 |

| THERMAL PROPERTIES | |
|---|---|
| $T_g$ (°C) | 569 |
| $T_S$ (°C) | 637 |
| $T_{10}^{14.5}$ (°C) | 511 |
| $T_{10}^{13}$ (°C) | 547 |
| α 20/120°C $(10^{-7}/K)$ | 71.72 |
| α 20/300°C $(10^{-7}/K)$ | 82.65 |

| nd = 1.51680 | νd = 64.2 | nF − nC = 0.008050 |
| ne = 1.51872 | νe = 64 | nF' − nC' = 0.008105 |

*Fig. 9B*

GLASS DATA

CONSTANTS OF DISPERSION FORMULA

| | |
|---|---|
| $A_0$ | 2.2702566 |
| $A_1$ | $-9.19881011 \times 10^{-3}$ |
| $A_2$ | $1.16097061 \times 10^{-2}$ |
| $A_3$ | $-7.61239111 \times 10^{-5}$ |
| $A_4$ | $2.85587271 \times 10^{-5}$ |
| $A_5$ | $-1.25664861 \times 10^{-5}$ |

RELATIVE PARTIAL DISPERSION

| $P_{d,c}$ | 0.3081 | $P'_{d,c}$ | 0.2568 |
|---|---|---|---|
| $P_{c,d}$ | 0.2385 | $P'_{c,d}$ | 0.2370 |
| $P_{g,F}$ | 0.5342 | $P'_{g,F}$ | 0.4753 |

DEVIATION OF RELATIVE PARTIAL DISPERSIONS $\Delta P$ FROM THE "NORMAL LINE"

| | |
|---|---|
| $\Delta P_{F,c}$ | $-0.0013$ |
| $\Delta P_{g,F}$ | $-0.0028$ |

MECHANICAL PROPERTIES

| | |
|---|---|
| $H_K$ $(10^7 Pa)$ | 595 |
| $F_A$ | 1 |
| $E$ $(10^7 Pa)$ | 7920 |
| $G$ $(10^7 Pa)$ | 3270 |
| $\mu$ | 0.211 |

STRESS-OPTICAL COEFFICIENT

| | |
|---|---|
| $B(10^{-12}/Pa)$ | 2.7 |

COLORATION CODE

| | |
|---|---|
| $\lambda_{80}/\lambda_5$ | 33/29 |

OTHER PROPERTIES

| | |
|---|---|
| $\rho$ $(g/cm^3)$ | 2.49 |

Fig. 9C

GLASS DATA

| INTERNAL TRANSMITTANCE | | |
|---|---|---|
| $\lambda$ (nm) | $\tau$ 5nm | $\tau$ 10nm |
| 2400 | 0.860 | 0.740 |
| 2200 | 0.930 | 0.860 |
| 2000 | 0.960 | 0.922 |
| 1800 | 0.985 | 0.970 |
| 1600 | 0.990 | 0.980 |
| 1400 | 0.995 | 0.990 |
| 1200 | 0.988 | 0.996 |
| 1060 | 0.988 | 0.996 |
| 1000 | 0.999 | 0.997 |
| 950 | 0.999 | 0.997 |
| 900 | 0.999 | 0.998 |
| 850 | 0.999 | 0.998 |
| 800 | 0.999 | 0.999 |
| 700 | 0.999 | 0.999 |
| 650 | 0.999 | 0.998 |
| 600 | 0.999 | 0.999 |
| 550 | 0.999 | 0.999 |
| 500 | 0.999 | 0.998 |
| 480 | 0.999 | 0.998 |
| 460 | 0.999 | 0.998 |
| 440 | 0.999 | 0.997 |
| 420 | 0.999 | 0.998 |
| 400 | 0.999 | 0.998 |
| 390 | 0.998 | 0.997 |
| 380 | 0.997 | 0.993 |
| 370 | 0.997 | 0.993 |
| 360 | 0.994 | 0.988 |
| 350 | 0.989 | 0.977 |
| 340 | 0.977 | 0.954 |
| 330 | 0.950 | 0.910 |

Fig. 9D

METAL CAP ASSEMBLY FOR OPTICAL COMMUNICATIONS

CROSS-REFERENCE TO RELATED APPLICATIONS

This application is a divisional of U.S. patent application Ser. No. 14/335,042, filed Jul. 18, 2014, which claims priority to U.S. Provisional Patent Application Ser. No. 61/856,303, filed Jul. 19, 2013 and titled VISI-CAP (OPTICAL COMMUNICATIONS CONTAINER), the entirety of which is incorporated by reference herein.

BACKGROUND

The subject disclosure is directed to the communication arts, the optical communications arts, the metallurgical arts, the container fabrication arts, the coating arts, the plating arts, and the like.

Optical communications are being used to replace current radio-wave communications, as radio-waves inherently limit the data transmission speed and may have some potential negative health effects. Optical communications is communication at a distance using light to carry information and uses a transmitter that encodes data into an optical signal, a channel that carries the light to a destination, and a receiver that receives the light and reproduces the information. Optical fiber is one of the most common types of channels for optical communications, although direct communication via air is also possible.

A problem with optical communication components involves the contamination of the light containing the message with exterior light sources, e.g., ambient light. Filtering is generally used to restrict the receipt of light by a receiver to a particular wavelength, generally associated with the wavelength particular to the transmitter, e.g., LED, laser diodes, etc. In enclosed systems, such as wired optical communication systems, various types of particulates (dust, etc.), moisture (water vapor, etc.) can affect and degrade the performance of data transmission, e.g., loss of data, slower times to compensate for post-reception filtering, lower bandwidth, etc.

In such enclosed systems, attachment of a filter can be an expensive and time consuming fabrication process. AR coatings generally do not react well to metallization sealing structures, and thus the coating cannot extend to all portions of a filter. The precise layering in small areas is problematic and leads to loss in output due to defective components, e.g., coating extended to non-coated area and bonding is not possible, and the like.

Thus, it would be advantageous to provide an assembly that is capable of providing a hermetically sealed environment for optical communications.

It would further be advantageous to provide a window that allows for optical communications with respect to the assembly.

It would further be advantageous to provide an assembly and filter capable of hermetic sealing against elements that can be readily adapted to a variety of applications, such as optical communication ports, optical transceivers, optical bridges, direct communication interfaces, and the like.

BRIEF DESCRIPTION

In one aspect of the exemplary embodiment, a cap assembly is provided that comprises housing. The housing includes a front side perpendicular from a bottom side, opposing parallel first and second sides perpendicular from the bottom side, and a back side disposed perpendicularly between the first side and the second side offset from respective ends of the first side and the second side opposite the front side. The back side includes an opening therethrough and a three-sided ledge formed along an interior of the first side leg, an exterior of the back side, and an interior of the second side leg. The cap assembly further includes a window configured to contact the three-sided ledge of the back side, the glass panel covering the opening therethrough.

In another aspect, a method of forming at least one window for attachment to a metal cap assembly is provided. The method includes coating each side of an associated wafer, and forming a pattern on one side of the associated wafer. The method further includes layering a metallization seal ring onto the pattern, and dicing the wafer in accordance with the pattern to form the at least one window.

In another aspect, a solder pre-form for hermetically sealing a multi-coated glass panel having a metallization seal ring layered around a perimeter of one side thereof to a cap assembly including a plated metal housing is provided. The pre-form includes at least one layer of gold and at least one layer of tin, wherein the pre-form is sized to affix to the metallization seal ring.

In accordance with one embodiment, there is provided a metal cap assembly comprised of an iron-nickel-cobalt alloy having a similar expansion behavior to that of borosilicate glass.

In another embodiment, there is provided a metal cap assembly coated in nickel and gold plating scheme that allows the cap assembly to accept and bond to a coated glass panel or window, as well as to allow application of the cap assembly to a silicon substrate.

In another embodiment, there is provided a window component that is selectively coated on each side, with a metallization seal ring affixed or deposited on one side to allow attachment and sealing of the window to the cap assembly.

In another embodiment, there is provided one or more gold-tin preforms in varying compositions that facilitate the joining of the window to the cap assembly and the cap assembly to a silicon substrate.

In such an embodiment, the one or more pre-forms may have different melting temperatures.

In another embodiment, a two stage solder joint of glass and metal seal applications is provided. A gold-tin eutectic alloy is used for sealing glass to metal via a solder as it melts at 280° C., e.g., 80/20 Au/Sn solder alloy. A second solder, which melts with lower temperature, is used to join the metal to a substrate, e.g., 90/10 Sn/Au solder alloy which melts 217° C., thereby completing a hermetically sealed interior within the metal cap assembly.

BRIEF DESCRIPTION OF THE DRAWINGS

The following is a brief description of the drawings are presented for the purposes of illustrating exemplary embodiments disclosed herein and not for the purposes of limiting the same.

FIG. 1D is a photograph of a back view of a prototype of the cap assembly shown in FIGS. 1A-1C without a glass panel attached in accordance with one embodiment of the present disclosure.

FIG. 1E is a photograph of a first front side view of the prototype of the cap assembly shown in FIG. 1D with the glass panel attached in accordance with one embodiment of the present disclosure.

FIG. 1F is a photograph of a back view of the prototype of the cap assembly shown in FIGS. 1D-1E with the glass panel attached in accordance with one embodiment of the present disclosure.

FIG. 1G is a photograph of a second front view of the prototype of the cap assembly shown in FIGS. 1D-1F with the glass panel attached in accordance with one embodiment of the present disclosure.

FIG. 2 illustrates the glass panel with metallized seal ring for used with the cap assembly of FIGS. 1A-1G in accordance with one embodiment of the present disclosure.

FIG. 7 illustrates a solder pre-form for use in attachment of the cap assembly of FIGS. 1A-1G to a substrate in accordance with one embodiment of the present disclosure.

FIGS. 8A-8B illustrate varying measurements of implementations of the glass panel in accordance with embodiments of the present disclosure.

FIGS. 9A-9D illustrate varying measurements of implementations of the glass panel in accordance with embodiments of the present disclosure.

DETAILED DESCRIPTION

Figure 1A:
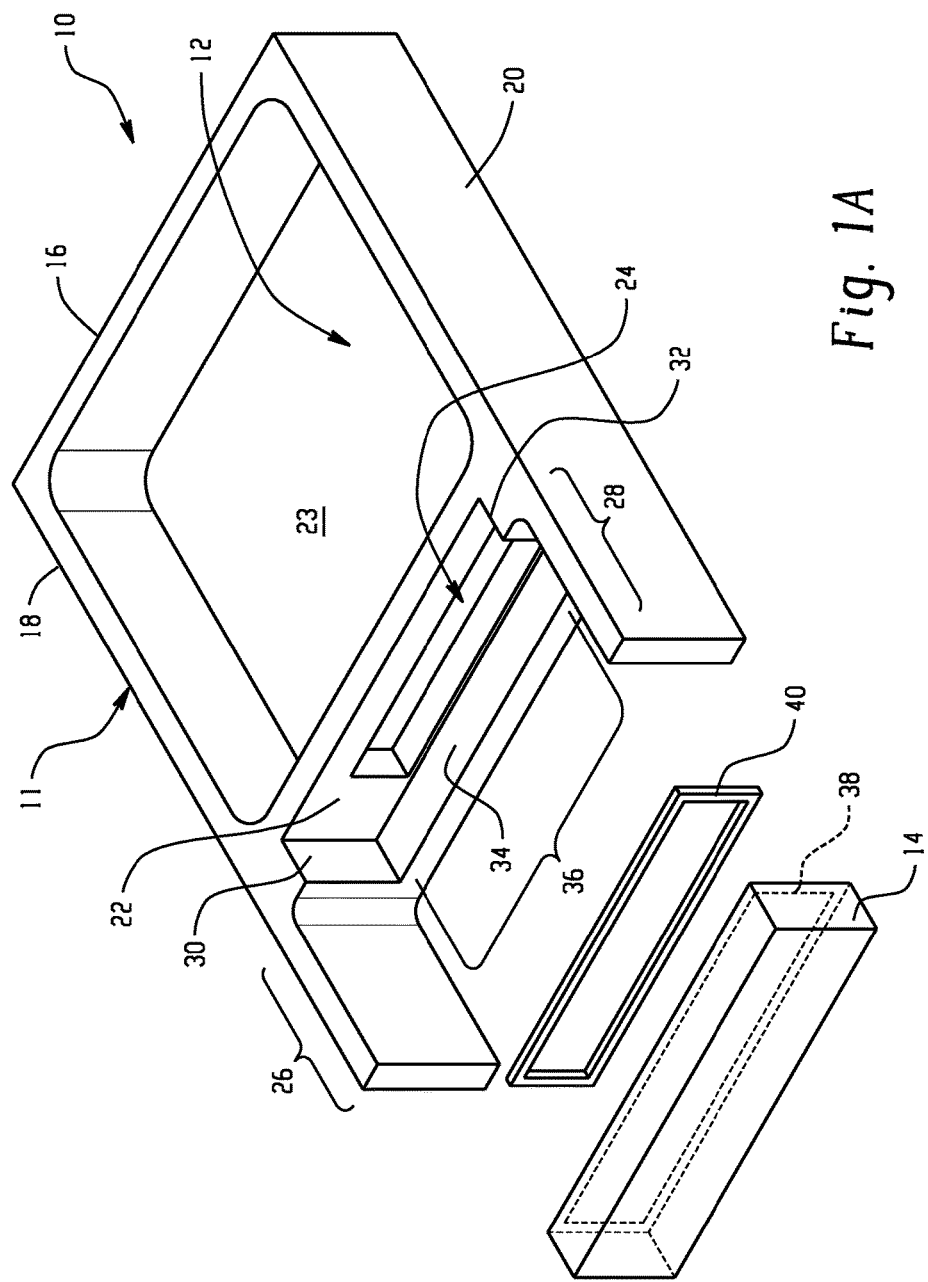
FIG. 1A is a three-dimensional view of a cap assembly in accordance with one embodiment of the present disclosure.

One or more embodiments will now be described with reference to the attached drawings, wherein like reference numerals are used to refer to like elements throughout.

Figure 1C:
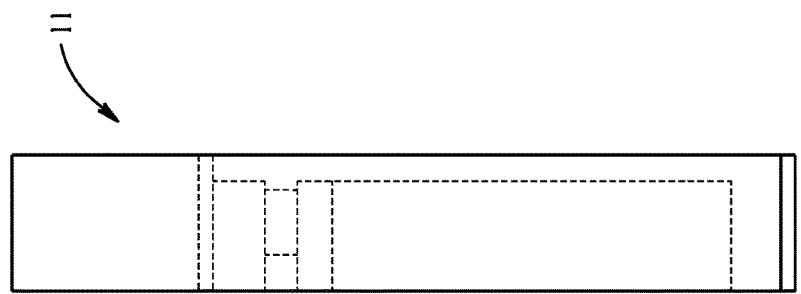
FIG. 1C is a side view of the cap assembly of FIG. 1A and FIG. 1B in accordance with one embodiment of the present disclosure.
Figure 1B:
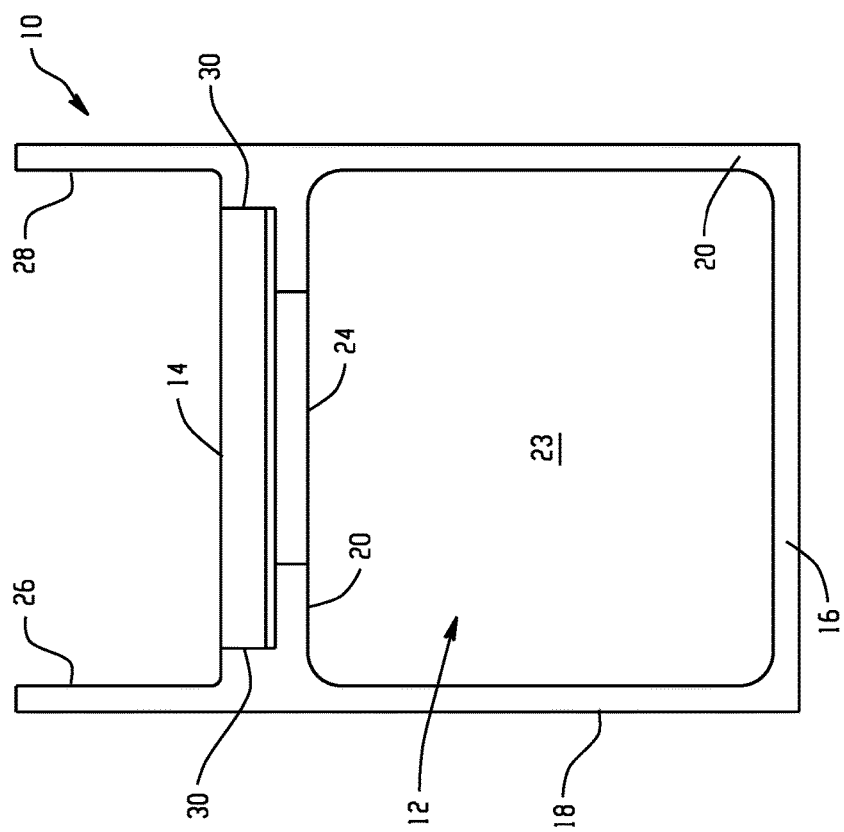
FIG. 1B is a top view of the cap assembly of FIG. 1A in accordance with one embodiment of the present disclosure.

Turning now to FIGS. 1A-1C, there are shown varying views (three-dimensional in FIG. 1A, top view in FIG. 1B, and side view in FIG. 1C) of an exemplary image of a cap assembly 10 in accordance with one embodiment of the subject disclosure. As shown in FIGS. 1A-1C, the cap assembly 10 includes a housing 11 that has a front side 16, a first side 18, a second side 20, a back side 22, and a bottom 23 forming a cavity 12 therein. The sides 16-22 are suitably positioned perpendicularly to the bottom 23 so as to form the cavity 12. In accordance with one embodiment, the housing 11 of the cap assembly 10 may be plated with one or more selected layers, such as a nickel layer and a gold layer. In such an embodiment, the plating may be an electrolytic plating of nickel at 4.31 μm and an electrolytic plating of gold at 0.5 μm.

The back side 22 is located perpendicularly between the first side 18 and the second side 20, offset from respective ends of the first side 18 and the second side 20. The portion of the first side 18 that extends past the back side 22 is the first leg 26 and the portion of the second side 20 that extends past the back side 22 is the second leg 28. In accordance with one embodiment, the first and second legs 26 and 28 are sized so as to reduce noise during transmission of light, as discussed more fully below.

Figure 11:
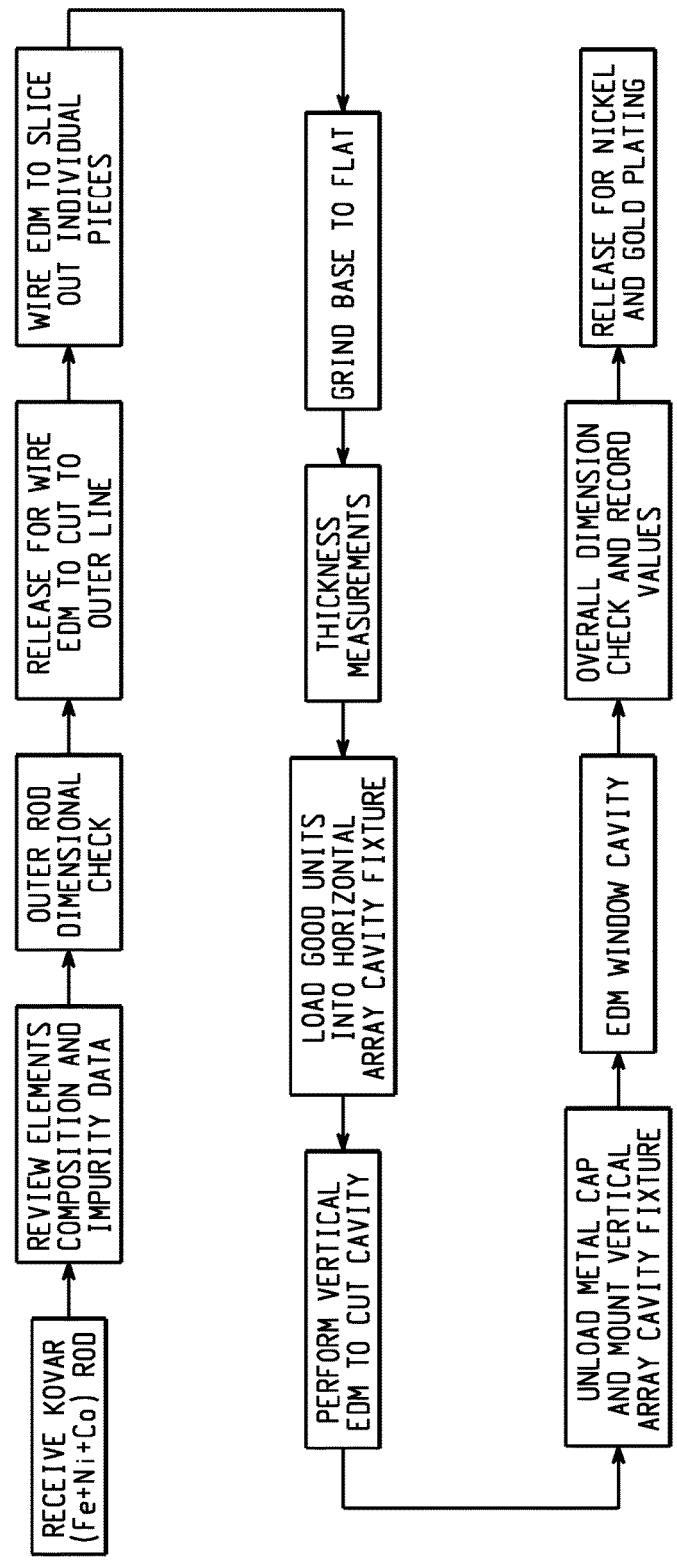
FIG. 11 illustrates a functional block diagram depicting a fabrication process of the cap assembly in accordance with one embodiment of the subject disclosure.

As shown in FIGS. 1A-1C, the back side 22 includes an opening 24 that extends through the back side 22 into the cavity 12. Formed along the lower perimeter of the back side 22 is a three-edged ledge 36 that consists of a first portion 30 on the interior of the first side leg 26, a second portion 32 on an interior of the second leg 28, and a third portion 34 located along a lower portion of an exterior of the back side 22. The process by which the housing 11 of the cap assembly 10 is fabricated is illustrated in the example depicted in FIG. 11. As shown in FIG. 11, fabrication may utilize machining, such as electrical discharge machining (wire EDM), mechanical machining, forging, or the like. Plating of the housing 11 includes nickel and gold as discussed elsewhere in the instant disclosure.

As shown in the example fabrication process of FIG. 11, after receipt of a Fe—Ni—Co rod (e.g., KOVAR), the element composition and impurity data of the received rod is first reviewed. After determining the material is in accordance with predetermined values, the dimensional values of the rod are determined. It will be appreciated that the size of the cap assembly 10 may vary depending upon the implementation of the completed assembly. As such, the dimensions of the rod are analyzed to ascertain whether sufficient material exists for forming the assembly 10. An electrical discharge machine may then cut the outer line of the assembly 10 from the rod, following individual slicing of the assemblies 10 formed therefrom. The individual assemblies 10 may then be partially finished (e.g., grinding, burr removal, etc.) prior to testing. Measurements as to the thickness of the cap assemblies are then made. Assemblies 10 meeting predetermined standards for thickness are then hollowed out, i.e., cavity formation, and window opening formation via EDM. After a final dimension measurement, the assemblies 10 meeting the predetermined standards are plated in Ni and Au.

Figure 3:
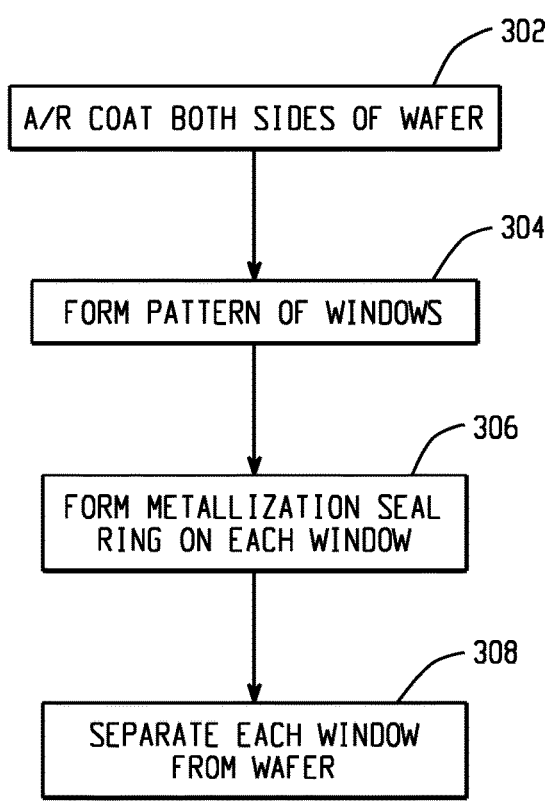
FIG. 3 is a flowchart illustrating the production of the glass panel of FIG. 2 for use with the cap assembly of FIGS. 1A-1G in accordance with one embodiment of the present disclosure.
Figure 4:
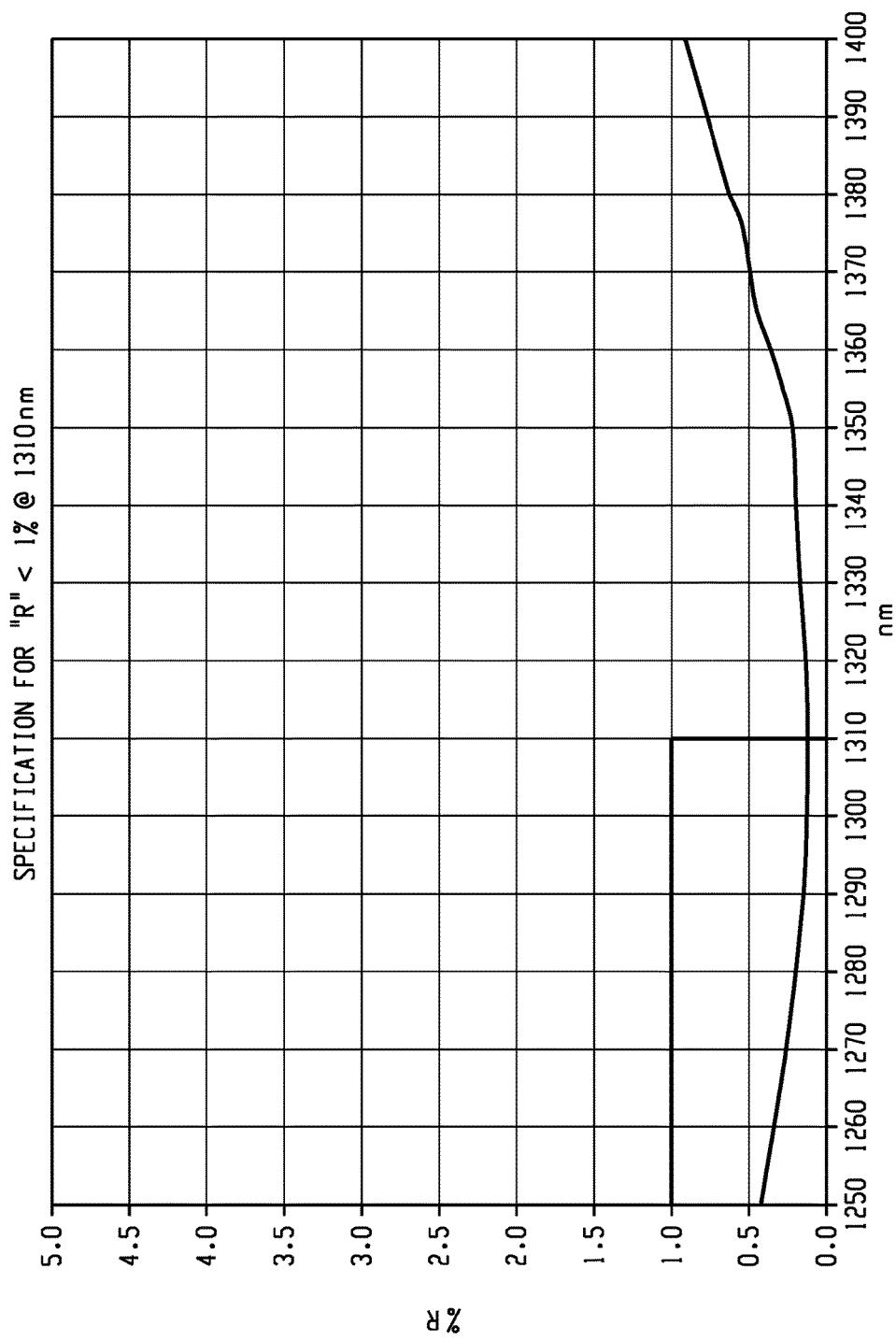
FIG. 4 graphically illustrates a reflectivity of the glass panel of FIG. 2 in accordance with one embodiment of the present disclosure.
Figure 5:
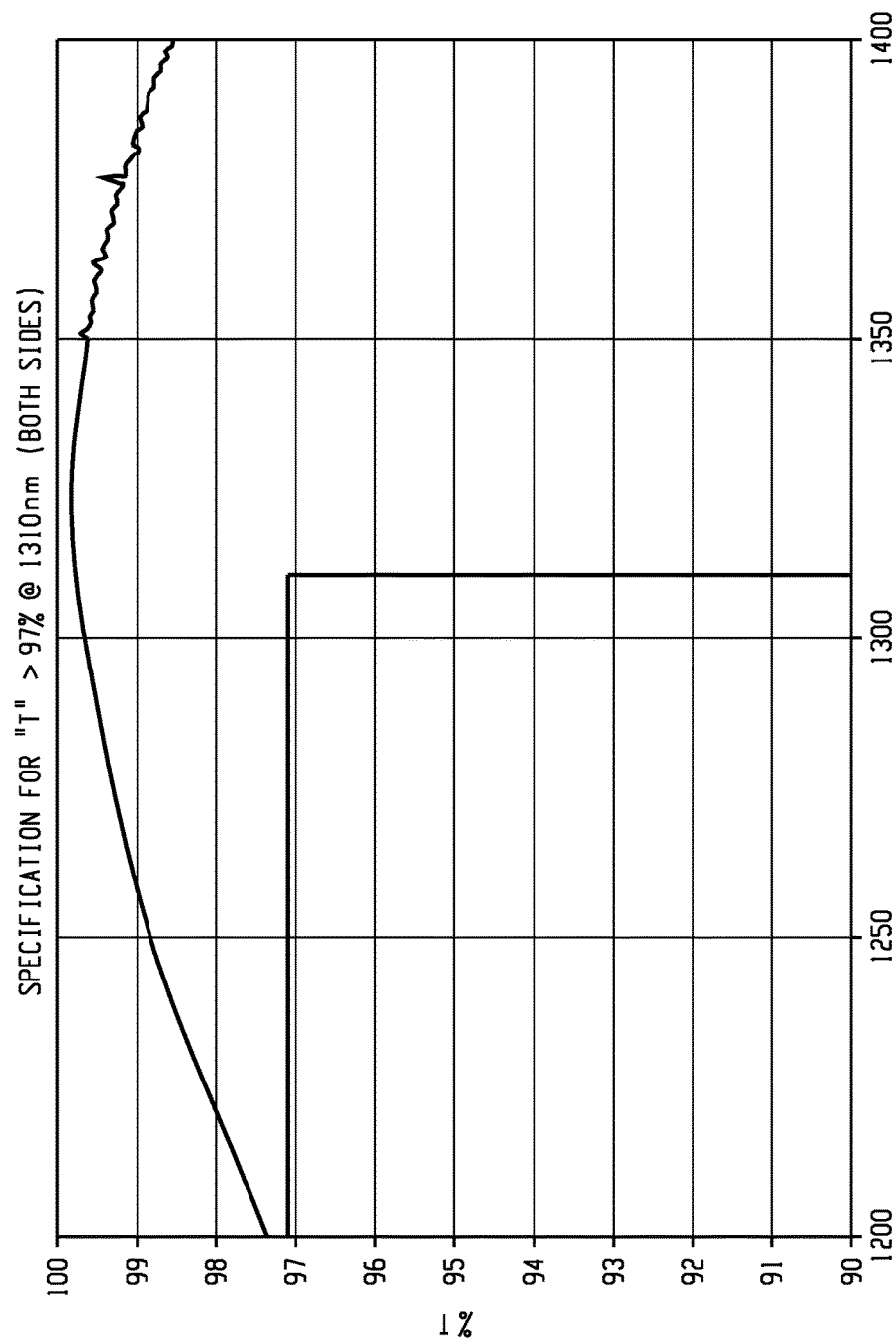
FIG. 5 graphically illustrates a transmission of the glass panel of FIG. 2 in accordance with one embodiment of the present disclosure.
Figure 12:
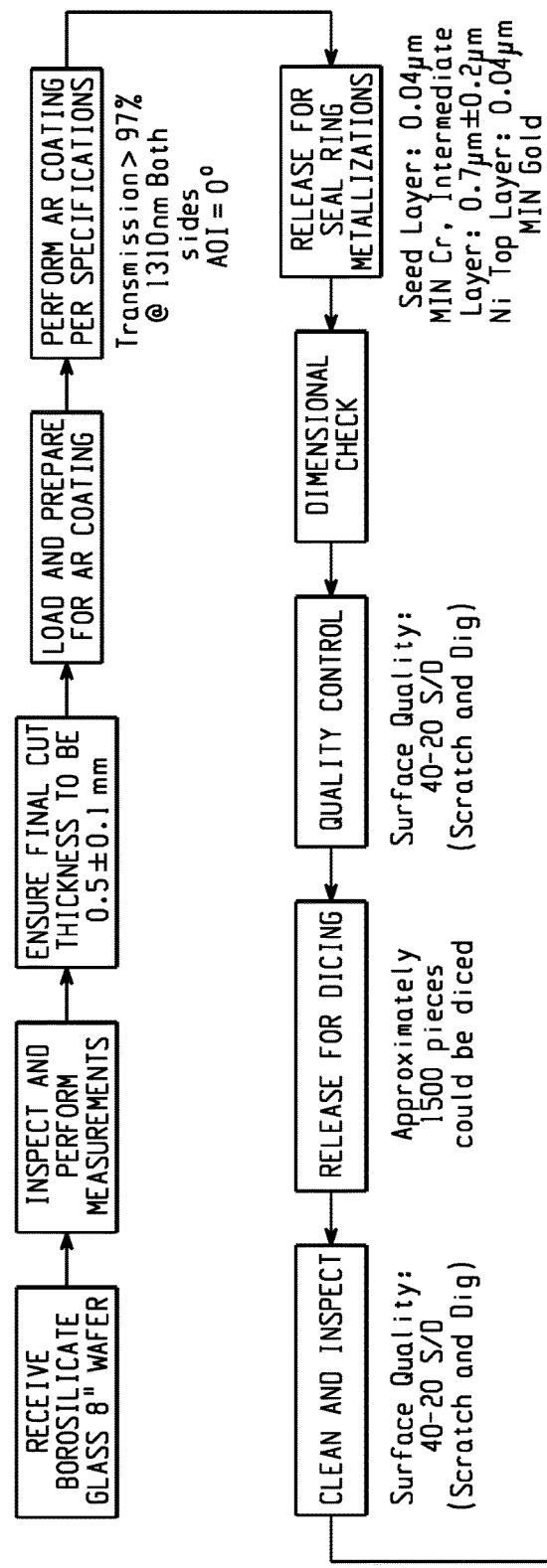
FIG. 12 illustrates a functional block diagram depicting a fabrication process of the window for the cap assembly in accordance with one embodiment of the subject disclosure.

The cap assembly 10, as shown in FIG. 1A further includes a window 14 that is sized to contact the three-sided ledge 36 of the housing 11. Turning now to FIG. 3, there is shown a flowchart illustrating a process for forming the window 14 for use in the cap assembly 10. It will be appreciated that the simplified method illustrated in FIG. 3 is associated with the 97% transmission and less than 0.5% reflectivity at 1310 nm wavelength discussed above. Beginning at 302, both sides of a borosilicate wafer are coated so as to allow 97% transmission of 1310 nm wavelength, with the reflectivity less than 1% for the 1310 nm spectrum. In one embodiment, the wafer, such as an 8-inch wafer, of borosilicate glass having a 0.25-0.75 mm thickness, is coated with multiple coating layers to achieve the aforementioned 97% transmission and 0.5-1% reflectivity at the 1310 nm wavelength. In such an example embodiment, the wafer may have a surface roughness of less than 130 nm and scratch/dig of 60/40. It will be appreciated that other wafers may be utilized in accordance with the embodiments described herein, and the values presented in the subject application pertain to a variety of example implementations. FIG. 4 illustrates a reflectivity performance curve and FIG. 5 illustrates a transmission performance curve of a suitable window 14 fabricated in accordance with the method of FIG. 3. FIGS. 8A-8B and 9A-9D provide illustrations and tables of varying implementations of the glass window 14, coatings, and the like, associated with embodiments contemplated in accordance with the subject disclosure. FIG. 12 provides an illustration of a functional block diagram explaining the fabrication process of FIG. 3 with respect to the production of windows 40 from the wafer. In accordance with one embodiment, the wafer undergoes multiple layers of coating, including a final layer of $SiO_2$. While referenced as pertaining to the 1310 nm spectrum, the coatings applied to the wafer may be varied in accordance with the selected spectrum, e.g., coatings specific to 1200 nm to 1610 nm.

At 304, a pattern is formed on the wafer corresponding to the pattern of deposition for a seal ring 38. At 306, a metallization seal ring 38 (as illustrated in FIG. 2) is then thin film coated on the wafer in accordance with the deposition pattern referenced above. In accordance with one embodiment, the metallization seal ring 38 on the window 14 is comprised of a preselected combination of metals, e.g., chromium, nickel, and gold are formed onto the window 14 prior to separation of the window 14 from the manufacturing wafer. As shown in FIG. 2, the metallization seal ring 38 includes a seed layer 39A, an intermediate layer 39B, and a top layer 39C. For example, the seed layer 39A may comprise 0.04 μm MIN chromium, the intermediate layer 39B may comprise 0.7 μm±0.2 μm nickel and the top layer 39C may comprise 0.04 μm MIN gold.

It will be appreciated that as discussed elsewhere herein, the seal ring 38 is slightly larger than the window preform 40 (shown in FIG. 6) so as to allow full wetting during soldering of the window 14 to the assembly 10 using the pre-form 40. It should also be appreciated that the entire surface of the wafer is AR coated, resulting in the metallization seal ring 38 being deposited on top of the coating, thereby allowing faster mass production of multiple windows 14. The present embodiments therefore prevent the inherent loss of windows 14 resulting from AR coating extending onto portions of the glass on which a metallization ring was to be deposited. The individual windows 14 are then separated from the wafer via dicing thereof at 308 for attachment to the cap assembly 10 as discussed below.

Interposed between the window 14 and the back side 22 of the housing 11 is a solder pre-form 40, which allows the formation of a hermetic seal between the glass of the window 14 and the housing 11. The solder pre-form 40 is suitable constructed to bond to the metallization ring 38 of the window 14.

Figure 6:
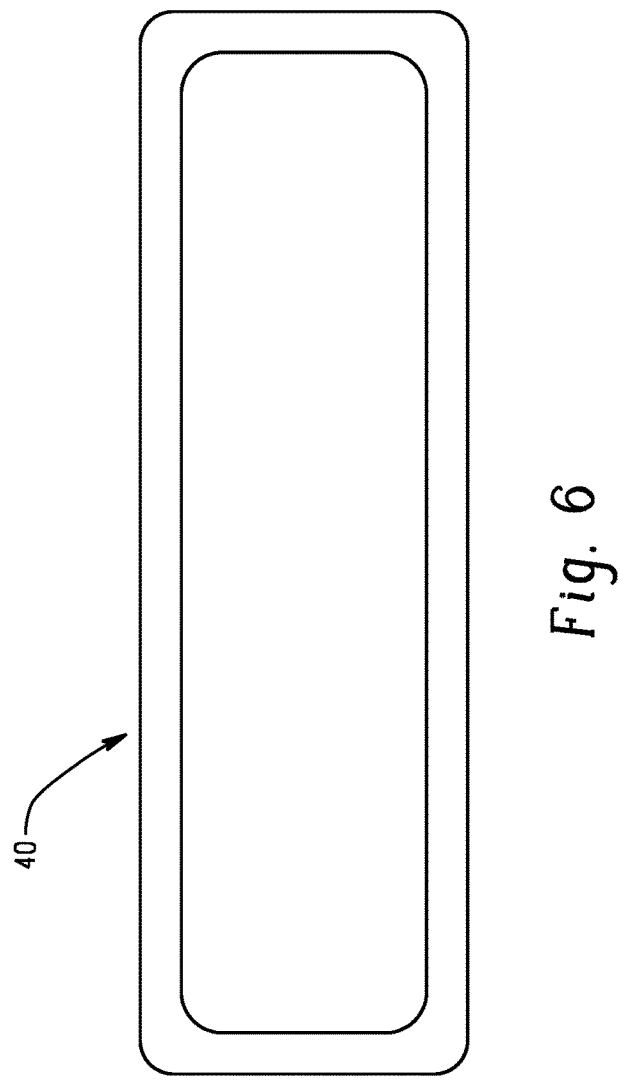
FIG. 6 illustrates a solder pre-form for use in attachment of the glass panel of FIG. 2 to the cap assembly of FIGS. 1A-1G in accordance with one embodiment of the present disclosure.
Figure 8A:
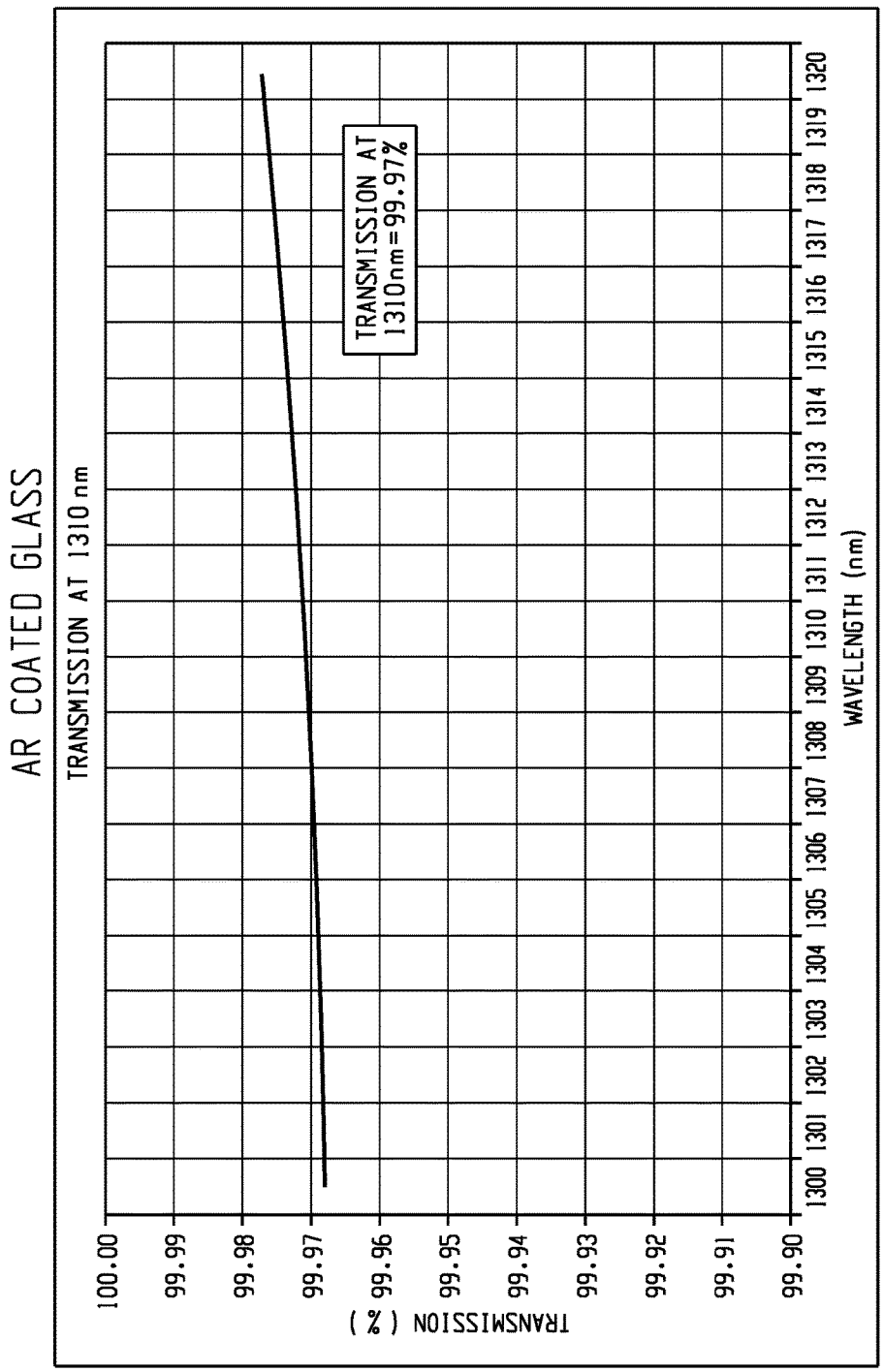
Figure 9A:
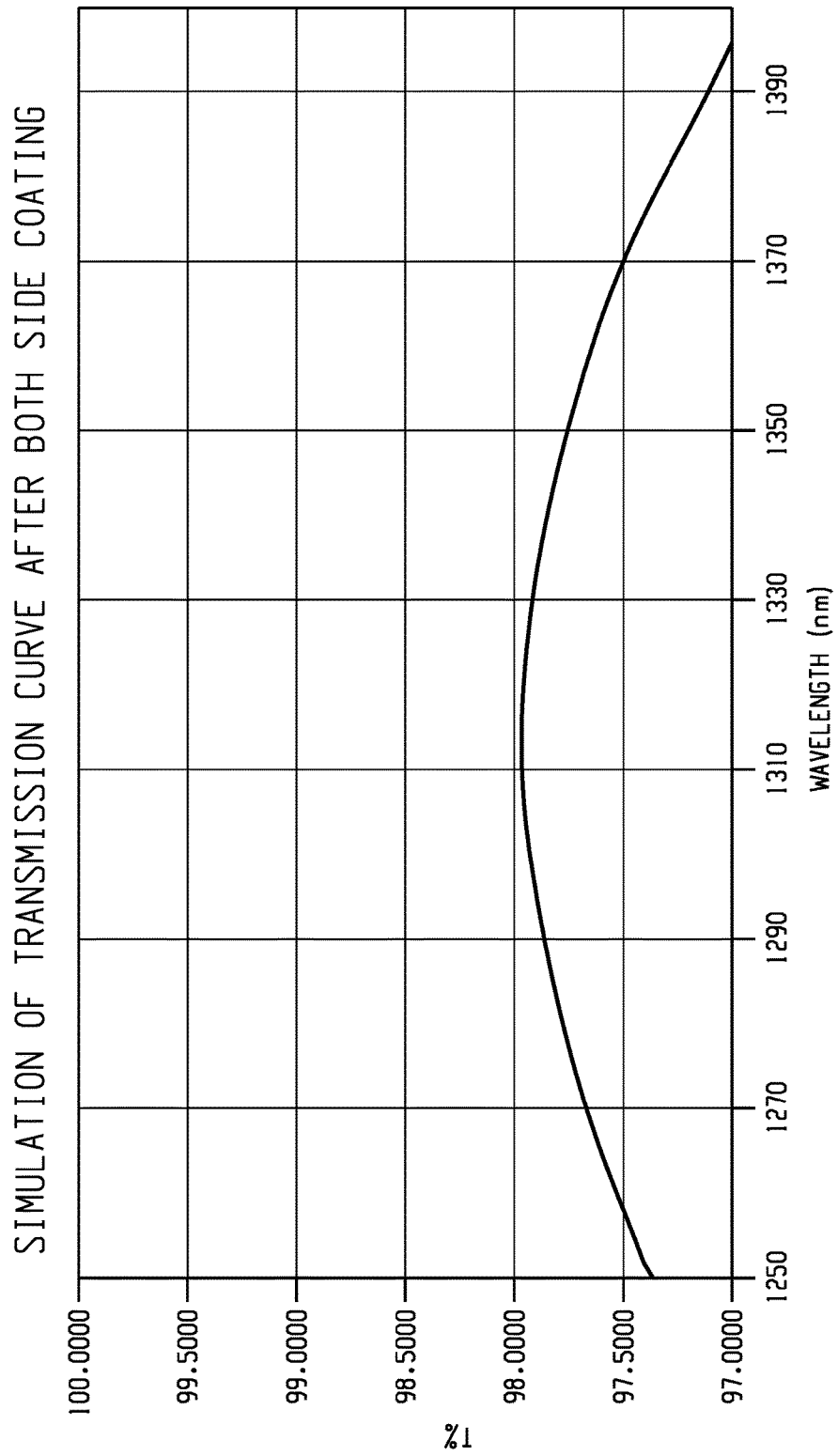

The cap assembly of claim 11, further comprising a solder pre-form 40 between the back side 22 and the window 14, the pre-form 40 configured to attach the window 14 to back side 22 via the metallization seal ring 38 deposited on the window 14 to form an hermetic seal there-between. An example of the solder pre-form 40 is depicted in FIG. 6. In accordance with such an example embodiment, the solder pre-form 40 is comprised of a gold and tin, with a melting temperature of 280° C. The relative composition of elements in the pre-form 40 may be 80% gold and 20% tin. It will be appreciated that the eutectic solder of 80% Au20% Sn has a single melting temperature of 280° C. The solder pre-form 40 may be formed via layering of the gold and tin, as will be appreciated.

Figure 10:
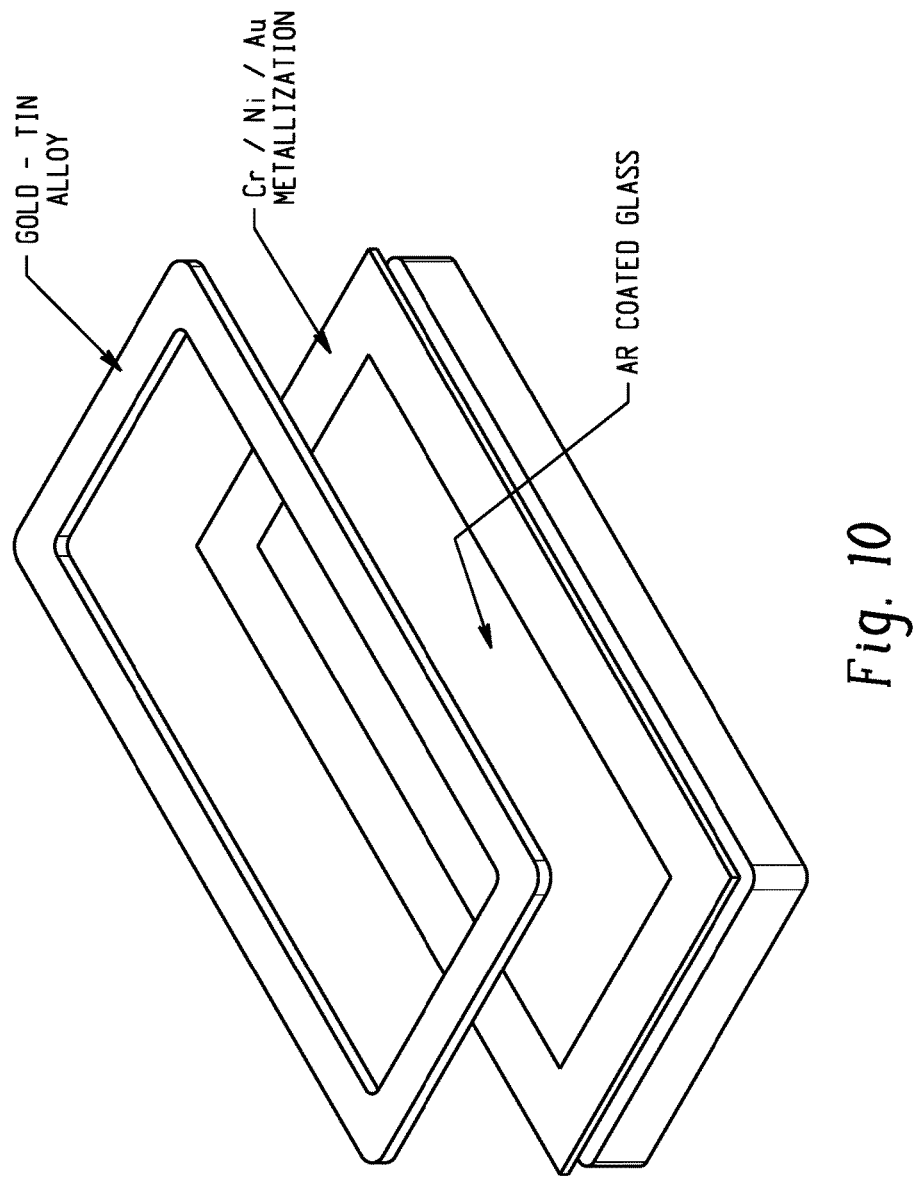
FIG. 10 illustrates a stack assembly of the solder pre-form, metallization seal ring and glass window in accordance with embodiments of the present disclosure.

As illustrated in FIG. 6, the shape of the solder pre-form 40 is similar to and approximately matches the shape of the metallization seal ring 38 on the window 40. That is, the solder pre-form 40 may be slightly smaller than the metallization seal ring 38 so as to allow full wetting of the solder pre-form 40 between the window 14 and the back side 22 of the housing 11, while also preventing any obstruction of the opening 24 through the coated glass window 14. It will be appreciated that the soldering of the window 14 to the back side 22 of the housing 11 may be accomplished via application of 280° C. with the solder pre-form 40 positioned there-between as shown in FIG. 1A. According to one embodiment, the solder pre-form 40 may be stamped to meet the metallization seal ring 38 on the window 40. The solder pre-form 40 may be used to seal the glass window 40 to the assembly 10 in an inert environment, e.g., nitrogen, nitrogen-hydrogen, etc. The solder pre-form 40 may be attached in such an environment without the addition of flux. A descriptive drawing of this attachment is illustrated in FIG. 10.

After the hermetic attachment of the window 14 to the back side 22 of the housing 11, the cap assembly 10 may be attached to a silicon substrate (not shown) on which are various optical communication components, e.g., transceivers, receivers, microprocessors, control logic, etc. In one embodiment, the cap assembly 10 may be attached to the silicon substrate using a second pre-form 42, illustrated in FIG. 7. As shown in FIG. 7, the second pre-form 42 is capable of attachment to the top of the sides 16-22 and legs 26-28. Use of the second pre-form 42 thereby enables the joining of the assembly 10 to a suitable substrate, thereby providing a hermetic sealing of the cavity 12 inside the housing 11. Such hermetic sealing may enable the protection of the internal components located in the housing 11 from dust, dirt, air (if vacuum or inert gas filled), light moisture, and the like.

In one embodiment, the second solder pre-form 42 is comprised of various metals having a melting temperature less than that of the first solder pre-form 40, so that deformation or leakage of the seal of the window 14 to the housing 11 does not occur upon attachment of the assembly 10 to the silicon substrate. It will be appreciated that while described with respect to attachment to a silicon substrate, other types of substrates may also be used in the instant disclosure, e.g., a metal substrate similar in composition to the plated housing 11, for example, may be used to hermetically seal the housing 11. For example, the second solder pre-form 42 may also be a combination of gold and tin, but varying in composition to have a melting temperature less than that of the first solder pre-form 40. In such an example implementation, the composition of the second solder pre-form 42 may comprise 90% tin and 10% gold, with a melting temperature of 217° C. It will be appreciated that variations on the relative percentages of gold and tin, or metals with similar properties, may be substituted in accordance with the embodiments discussed herein.

TABLE 1, presented below, provides various solders, their respective melting points, and compositions.

| WAM Solder | Nominal Composition Wt. % | Liquidus C | Liquidus F | Solidus C | Solidus F | Density (g/cc) | Electrical Conductivity (% of IACS) | Thermal Conductivity (W/m * C) | Thermal Coefficient of Expansion (Micro in/in/C) (20 C) | Tensile Strength (psi) |
|---|---|---|---|---|---|---|---|---|---|---|
| WS96* | 30Pb, 18Sn, Bi52 | 96 | 205 | 96 | 205 | 9.58 | 3.2 | 15 | 38.0 | 3200 |
| WS118 | 48Sn, 52In | 118 | 244 | 118 | 244 | 7.30 | 11.7 | 34 | 20.0 | 1720 |
| WS143 | 3Ag, 97In | 143 | 290 | 143 | 290 | 7.38 | 4.5 | 73 | 22.0 | 800 |
| WS145 | 58Sn, 42In | 118 | 244 | 145 | 293 | 7.30 | 11.2 | 31 | 31.0 | 5900 |
| WS149* | 5Ag, 15Pb, 80In | 149 | 288 | 149 | 300 | 7.85 | 6.7 | 43 | 28.0 | 2550 |
| WS157 | 100In | 157 | 315 | 157 | 315 | 7.31 | 5.6 | 82 | 24.8 | 575 |
| WS174* | 30Pb, 70In | 165 | 329 | 174 | 347 | 8.19 | 8.8 | 38 | 28.0 | 3450 |
| WS179 | 2Ag, 36Pb, 62Sn | 179 | 354 | 179 | 354 | 8.41 | 11.9 | 42 | 27.0 | 6380 |
| WS181* | 37.5Pb, 37.5Sn, 25In | 134 | 273 | 181 | 358 | 8.42 | 7.8 | 23 | 23.0 | 5260 |
| WS183* | 37Pb, 63Sn | 183 | 361 | 183 | 361 | 8.34 | 11.8 | 51 | 25.0 | 7500 |
| WS185* | 40Pb, 60In | 173 | 343 | 185 | 358 | 8.52 | 7.0 | 29 | 53.0 | 4150 |
| WS186* | 30Pb, 70Sn | 183 | 361 | 186 | 367 | 8.17 | 12.5 | 53 | 27.0 | 7800 |
| WS187 | 2.8Ag, 77.2Sn, 20In | 175 | 347 | 187 | 369 | 7.25 | 9.8 | 54 | 28.0 | 6800 |
| WS188* | 40Pb, 60Sn | 183 | 361 | 188 | 376 | 8.50 | 11.5 | 49 | 21.6 | 7610 |
| WS199* | 20Pb, 80Sn | 183 | 361 | 199 | 390 | 7.85 | 13.8 | 59 | 24.5 | 5800 |
| WS200* | 45Pb, 55Sn | 183 | 361 | 200 | 392 | 8.68 | 11.2 | 48 | 22.6 | 6800 |
| WS205* | 15Pb, 85Sn | 183 | 361 | 205 | 401 | 7.70 | 13.6 | 58 | 22.0 | 5300 |
| WS209* | 50Pb, 50In | 184 | 363 | 209 | 410 | 8.86 | 6.0 | 22 | 27.0 | 4670 |
| WS212* | 50Pb, 50Sn | 183 | 361 | 212 | 414 | 8.87 | 10.9 | 47 | 23.6 | 6000 |
| WS213* | 10Pb, 90Sn | 183 | 361 | 213 | 415 | 7.55 | 13.1 | 56 | 26.5 | 3300 |
| WS217 | 10Au, 90Sn | 217 | 423 | 217 | 423 | 7.73 | 10.2 | 28 | 14.0 | 15000 |
| WS221 | 3.5Ag, 96.5Sn | 221 | 430 | 221 | 430 | 7.36 | 16.0 | 33 | 30.2 | 5620 |
| WS225* | 60Pb, 40In | 205 | 401 | 225 | 437 | 9.30 | 5.2 | 19 | 26.0 | 5000 |
| WS226 | 3.5Ag, 95Sn, 1.5Sb | 218 | 424 | 226 | 439 | 7.37 | 11.9 | 29 | 18.0 | 7300 |
| WS226A | 2.5Ag, 97.5Sn | 221 | 430 | 226 | 439 | 7.34 | 11.2 | 28 | 19.5 | 6200 |
| WS232 | 100Sn | 232 | 450 | 232 | 450 | 7.28 | 15.6 | 73 | 23.5 | 1900 |
| WS235 | 99Sn, 1Sb | 235 | 455 | 235 | 455 | 7.27 | 12.3 | 29 | 22.0 | 2620 |
| WS238* | 60Pb, 40Sn | 183 | 361 | 238 | 460 | 9.28 | 10.1 | 44 | 24.7 | 5400 |
| WS238A | 97Sn, 3Sb | 232 | 450 | 238 | 460 | 9.28 | 12.1 | 28 | 25.0 | 4080 |
| WS240 | 95Sn, 5Sb | 232 | 450 | 240 | 464 | 7.25 | 11.9 | 28 | 27.0 | 5460 |
| WS243* | 63.2Pb, 35Sn, 1.8In | 185 | 365 | 243 | 469 | 9.39 | 9.5 | 41 | 21.0 | 2900 |
| WS257* | 70Pb, 30Sn | 183 | 361 | 257 | 495 | 9.66 | 9.3 | 41 | 25.6 | 5000 |
| WS264* | 75Pb, 25In | 240 | 464 | 264 | 500 | 9.97 | 4.6 | 18 | 26.0 | 5450 |
| WS280* | 80Pb, 20Sn | 183 | 361 | 280 | 536 | 10.04 | 8.7 | 37 | 26.5 | 4800 |
| WS280A* | 81Pb, 19In | 270 | 518 | 280 | 536 | 10.27 | 4.5 | 17 | 27.0 | 5550 |
| WS280B | 80Au, 20Sn | 280 | 536 | 280 | 536 | 14.51 | 7.7 | 57 | 15.9 | 40000 |
| WS286* | 86Pb, 8Bi, 4Sn, 1In, 1Ag | 268 | 514 | 286 | 547 | 10.91 | 5.6 | 33 | 22.4 | 5317 |
| WS288* | 85Pb, 15Sn | 183 | 361 | 288 | 550 | 10.48 | 8.5 | 37 | 27.2 | 4600 |
| WS290* | 2Ag, 88Pb, 10Sn | 268 | 513 | 290 | 570 | 10.75 | 8.5 | 27 | 29.1 | 3260 |
| WS292* | 5Ag, 90Pb, 5Sn | 292 | 558 | 292 | 558 | 11.00 | 7.7 | 26 | 26.0 | 5100 |
| WS295* | 95Pb, 5Sb | 252 | 486 | 295 | 563 | 10.96 | 6.2 | 27 | 27.0 | 4200 |
| WS296* | 2.5Ag, 92.5Pb, 5Sn | 287 | 549 | 296 | 565 | 11.02 | 7.6 | 26 | 24.0 | 3500 |
| WS300* | 2.5Ag, 92.5Pb, 5In | 300 | 572 | 300 | 572 | 11.02 | 5.5 | 25 | 25.0 | 4560 |
| WS302* | 90Pb, 10Sn | 275 | 527 | 302 | 576 | 10.50 | 8.2 | 36 | 27.9 | 4400 |
| WS303* | 2.5Ag, 97.5Pb | 303 | 577 | 303 | 577 | 11.33 | 7.5 | 26 | 23.0 | 5900 |
| WS304* | 2.5Ag, 95.5Pb, 2Sn | 299 | 570 | 304 | 579 | 11.20 | 7.6 | 26 | 23.0 | 3400 |
| WS305 | 78Au, 22Sn | 280 | 536 | 305 | 581 | 14.81 | 7.7 | 57 | 15.9 | 40000 |
| WS309* | 1.5Ag, 97.5Sn, 1Sn | 309 | 588 | 309 | 588 | 11.28 | 6.0 | 23 | 30.4 | 4420 |
| WS310* | 5Ag, 90Pb, 5In | 290 | 554 | 310 | 590 | 11.00 | 6.4 | 29 | 24.0 | 4500 |
| WS314* | 95Pb, 5In | 300 | 572 | 314 | 597 | 11.06 | 5.1 | 21 | 29.0 | 4330 |
| WS314A* | 95Pb, 5Sn | 310 | 590 | 314 | 597 | 10.80 | 8.1 | 35 | 28.4 | 4000 |
| WS327* | 100Pb | 327 | 621 | 327 | 621 | 11.35 | 8.4 | 15 | 29.3 | 2750 |

-continued

| WAM Solder | Nominal Composition Wt. % | Liquidus C | Liquidus F | Solidus C | Solidus F | Density (g/cc) | Electrical Conductivity (% of IACS) | Thermal Conductivity (W/m * C) | Thermal Coefficient of Expansion (Micro in/in/C) (20 C) | Tensile Strength (psi) |
|---|---|---|---|---|---|---|---|---|---|---|
| WS361 | 88Au, 12Ge | 361 | 682 | 361 | 682 | 14.67 | 11.4 | 44 | 13.4 | 26900 |
| WS363 | 96.85Au, 3.15Si | 363 | 685 | 363 | 685 | 15.70 | 46.4 | 27 | 12.3 | 37000 |
| WS487 | 81.Au, 19In | 487 | 909 | 487 | 909 | 14.72 | 8.4 | 28 | 14.7 | 33700 |

*Contains Lead + Lead Free Solders

It will be appreciated the solders presented in TABLE 1 may be utilized for either the first pre-form 40 or the second pre-form 42 in accordance with the type of coating on the window 14, the plating on the assembly 10, the type of substrate (not shown) to which the cap assembly 10 will be attached, or combinations thereof. Accordingly, different melting temperatures of the pre-forms 40 and 42 may be needed based upon the type of AR coating (so as not to damage the coating). Similarly, variations as to the composition of the metallization seal ring 38 may be necessitated to accommodate changes in make-up of the composition of the pre-form 40 and/or the assembly 10.

In accordance with one embodiment, the hermetically sealable cap assembly for use in open air optical communications. Current radio wave communications have limitations on the speed of data transfer without causing increased harm to humans. In such an implementation, the glass window of the cap assembly is coated with a single wavelength anti-reflective coating corresponding to laser data transmittal. The references above to the 1310 nm wavelength is intended for example purposes only, as such a wavelength corresponds to the wavelength of light utilized in fiber-optic cables to transmit data between sites, which light may be generated by a Gallium-Arsinide semiconductor laser diode. Depending upon the coherent technology used and bit rates desired, other wavelengths of light may be utilized. In such instances, the coating of the window may be modified to reflect the common peak wavelengths (780 nm, 850 nm, 1550 nm, 1625 nm, etc.) corresponding to the light source and detector technology implemented. Accordingly, it will be appreciated that the subject application may be adapted in accordance with the intended communication system.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of forming at least one window for attachment to a metal cap assembly, comprising:
    coating each side of an associated wafer;
    forming a pattern on one side of the associated wafer;
    layering a metallization seal ring onto the coating of the one side of the associated wafer in accordance with the pattern formed thereon; and
    dicing the wafer in accordance with the pattern to form the at least one window, wherein the pattern is formed around the perimeter of the at least one window.

2. The method according to claim 1, wherein layering the metallization seal ring onto the coating of the one side of the associated wafer in accordance with the pattern formed thereon further comprises layering a seed layer, an intermediate layer and a top layer onto said pattern.

3. The method according to claim 2, wherein the seed layer comprises chromium, the intermediate layer comprises nickel, and the top layer comprises gold.

4. The method according to claim 3, wherein attachment of the at least one window to the cap assembly comprises forming a hermetic seal between the at least one window and a back side of a housing of the metal cap assembly using a first solder pre-form inserted therebetween, wherein the housing includes:
    a back side of the housing, which includes an opening therethrough; and
    a first and second side of the housing, which both extend past the back side of the housing,
    wherein the at least one window is configured to contact the back side of the housing covering the opening, but does not extend past the first and second sides of the housing.

* * * * *